(12) United States Patent
Lim

(10) Patent No.: US 10,402,267 B2
(45) Date of Patent: Sep. 3, 2019

(54) MEMORY SYSTEM AND OPERATING METHOD THEREOF

(71) Applicant: SK hynix Inc., Gyeonggi-do (KR)

(72) Inventor: Su-Jin Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/826,824

(22) Filed: Nov. 30, 2017

(65) Prior Publication Data

US 2018/0217895 A1 Aug. 2, 2018

(30) Foreign Application Priority Data

Feb. 2, 2017 (KR) .................. 10-2017-0015167

(51) Int. Cl.
| | |
|---|---|
| *G06F 11/10* | (2006.01) |
| *G11C 29/52* | (2006.01) |
| *H03M 13/27* | (2006.01) |
| *G11C 29/42* | (2006.01) |
| *G11C 29/44* | (2006.01) |
| *G11C 29/04* | (2006.01) |

(52) U.S. Cl.
CPC .......... *G06F 11/1068* (2013.01); *G11C 29/42* (2013.01); *G11C 29/4401* (2013.01); *H03M 13/2778* (2013.01); *G11C 29/52* (2013.01); *G11C 2029/0411* (2013.01); *G11C 2029/4402* (2013.01)

(58) Field of Classification Search
CPC . G06F 11/1068; G11C 29/42; G11C 29/4401; G11C 29/52; G11C 2029/0411; G11C 2029/4402; H03M 13/2778
See application file for complete search history.

(56) References Cited

U.S. PATENT DOCUMENTS

| | | | |
|---|---|---|---|
| 9,092,362 B1* | 7/2015 | Alcantara | G06F 12/0246 |
| 2009/0055680 A1* | 2/2009 | Honda | G06F 11/1068 714/5.1 |
| 2010/0077266 A1* | 3/2010 | Kanno | G06F 11/1068 714/704 |
| 2010/0251075 A1* | 9/2010 | Takahashi | G06F 11/1068 714/773 |
| 2013/0111299 A1* | 5/2013 | Hashimoto | G06F 11/1068 714/758 |
| 2013/0159610 A1* | 6/2013 | Kawamura | G06F 12/0246 711/103 |
| 2014/0281678 A1* | 9/2014 | Haga | G06F 11/1048 714/6.1 |

FOREIGN PATENT DOCUMENTS

| | | |
|---|---|---|
| KR | 101522744 | 5/2015 |
| KR | 1020150091693 | 8/2015 |

\* cited by examiner

*Primary Examiner* — Kyle Vallecillo
(74) *Attorney, Agent, or Firm* — IP & T Group LLP

(57) ABSTRACT

A memory system may include: a memory device including a plurality of memory blocks each having a plurality of sub memory blocks; and a controller suitable for performing an error correction operation to the memory blocks during a read operation to the memory blocks, updating a characteristic list for the memory blocks at each error correction operation to the memory blocks, classifying the memory blocks and the sub memory blocks according to the updated values in the characteristic list, and performing a program operation to the memory blocks according to the classification.

18 Claims, 13 Drawing Sheets

| Index (702) | Error Correction Count (704) | Distribution Degree (706) | Sub Block 1 (708) | Sub Block 2 (710) | Sub Block 3 (712) | Sub Block 4 (714) | Sub Block 5 (716) | Sub Block 6 (718) |
|---|---|---|---|---|---|---|---|---|
| Block 10 | 13 | 3 | 6 | 0 | 0 | 3 | 0 | 4 |
| Block 25 | 12 | 6 | 2 | 1 | 3 | 1 | 2 | 3 |
| Block 35 | 12 | 2 | 0 | 0 | 6 | 0 | 8 | 0 |
| Block 50 | 17 | 6 | 5 | 3 | 1 | 4 | 2 | 2 |
| Block 70 | 18 | 6 | 2 | 4 | 6 | 3 | 1 | 2 |
| Block 80 | 14 | 6 | 1 | 3 | 2 | 4 | 3 | 1 |

MEMORY SYSTEM AND OPERATING METHOD THEREOF

CROSS-REFERENCE TO RELATED APPLICATION

This application claims priority under 35 U.S.C. § 119 to Korean Patent Application No. 10-2017-0015167 filed on Feb. 2, 2017 in the Korean Intellectual Property Office, the disclosure of which is incorporated herein by reference in its entirety.

TECHNICAL FIELD

Exemplary embodiments relate to a memory system, and more particularly, to a memory system which processes data with respect to a memory device, and an operating method thereof.

DISCUSSION OF THE RELATED ART

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Various embodiments are directed to a memory system capable of minimizing its complexity and performance deterioration, maximizing the use efficiency of a memory device, and quickly and stably processing data to the memory device, and an operating method thereof.

In an embodiment, a memory system may include: a memory device including a plurality of memory blocks each having a plurality of sub memory blocks; and a controller suitable for performing an error correction operation to the memory blocks during a read operation to the memory blocks, updating a characteristic list for the memory blocks at each error correction operation to the memory blocks, classifying the memory blocks and the sub memory blocks according to the updated values in the characteristic list, and performing a program operation to the memory blocks according to the classification.

The characteristic list may contain error correction counts for each memory block and wherein the controller updates the error correction counts in the characteristic list by counting the error correction decoding operations which are performed to the respective sub memory blocks of each memory block during the read operation.

The respective memory blocks may include a plurality of sub memory blocks, and the sub memory blocks may be configured as a plurality of word lines included in the memory blocks are grouped or a plurality of pages included in the memory blocks are grouped.

The controller may update the characteristic list further by counting, as an error correction count for each of the memory blocks, total number of the error correction decoding operations, which are performed to the sub memory blocks included in a corresponding memory block during the read operation, into the characteristic list.

The controller may update the characteristic list further by counting, as a distribution degree for each of the memory blocks, a number of sub memory blocks, to which the error correction operation is performed in a corresponding memory block during the read operation, into the characteristic list.

The controller may determine characteristics of the memory blocks and characteristics by the sub memory blocks of the memory blocks, through the error correction counts, the distribution degrees and the failure informations.

The controller may levelize and classify the memory blocks and the sub memory blocks according to the characteristics by the memory blocks and the characteristics by the sub memory blocks.

The controller may classify and manage memory blocks of the same characteristic and sub memory blocks of the same characteristic, in the same manner.

The controller may perform command operations corresponding to commands received from the host, in a general mode, for memory blocks and sub memory blocks of an upper characteristic, and the controller may perform command operations corresponding to commands received from the host, in a specified mode, for memory blocks and sub memory blocks of a lower characteristic.

The controller may perform command operations corresponding to commands received from the host, by the memory blocks, through interleaving the sub memory blocks of the same characteristic.

In an embodiment, a method for operating a memory system including a plurality of memory blocks each having a plurality of sub memory blocks, the method may include: performing an error correction operation to the memory blocks during a read operation to the memory blocks; updating a characteristic list for the memory blocks at each error correction operation to the memory blocks; classifying the memory blocks and the sub memory blocks according to the values updated in the characteristic list; and performing a program operation to the memory blocks according to the classification.

The updating may include counting numbers of the error correction decoding operations, which are performed to the respective sub memory blocks of the respective memory blocks during the read operation, into the characteristic list.

The respective memory blocks may include a plurality of sub memory blocks, and the sub memory blocks may be configured as a plurality of word lines included in the memory blocks are grouped or a plurality of pages included in the memory blocks are grouped.

The updating may include counting, as an error correction count for each of the memory blocks, total number of the error correction decoding operations, which are performed to the sub memory blocks included in a corresponding memory block during the read operation, into the characteristic list.

The updating may include counting, as a distribution degree for each of the memory blocks, a number of sub memory blocks, to which the error correction operation is performed in a corresponding memory block during the read operation, into the characteristic list.

The managing may include: determining characteristics by the memory blocks and characteristics by the sub memory blocks of the memory blocks, through the error correction counts, the distribution degrees and failure informations.

The managing may further include: levelizing and classifying the memory blocks and the sub memory blocks according to the characteristics by the memory blocks and the characteristics by the sub memory blocks.

The managing may classify and manage memory blocks of the same characteristic and sub memory blocks of the same characteristic, in the same manner.

The managing may further include: performing command operations corresponding to commands received from the host, in a general mode, for memory blocks and sub memory blocks of an upper characteristic; and performing command operations corresponding to commands received from the host, in a specified mode, for memory blocks and sub memory blocks of a lower characteristic.

The managing may further include: performing command operations corresponding to commands received from the host, by the memory blocks, through interleaving the sub memory blocks of the same characteristic.

DETAILED DESCRIPTION

Figure 1:
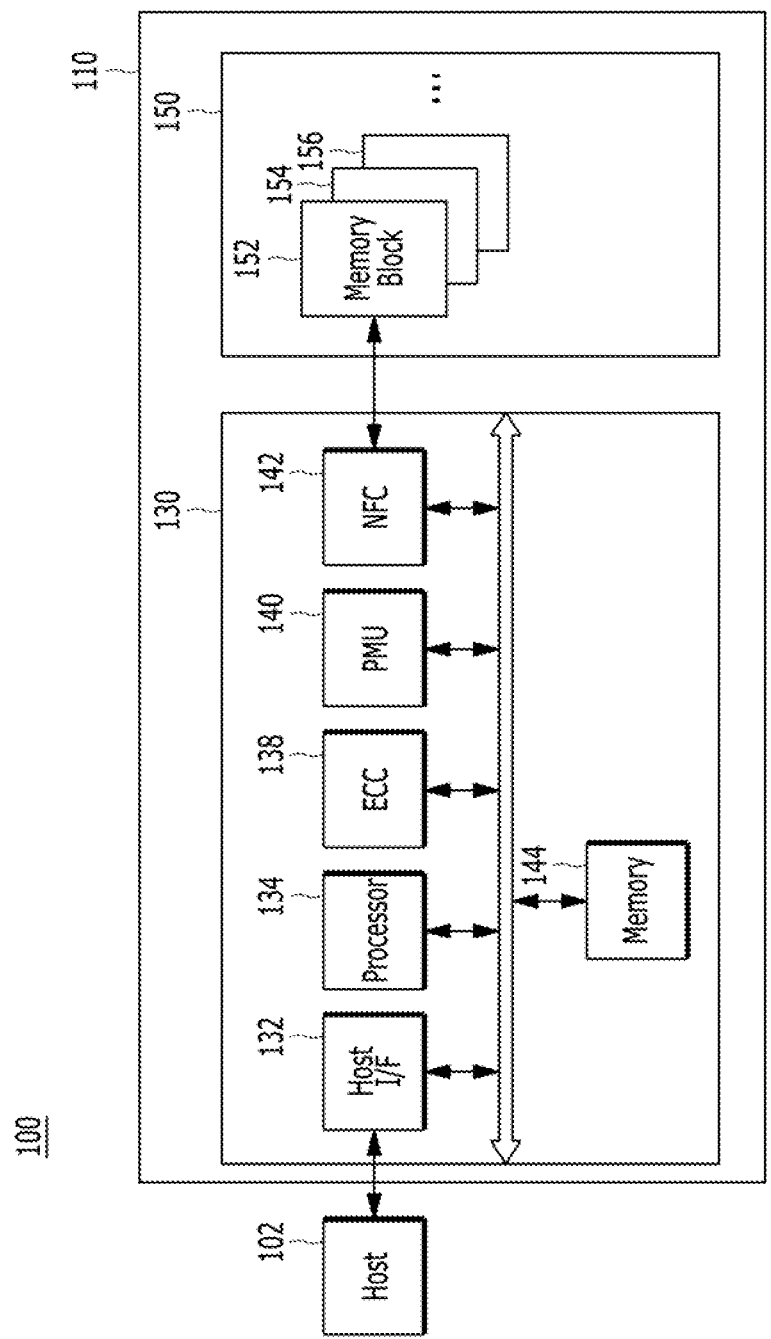
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure to and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include portable electronic devices such as a mobile phone, MP3 player and laptop computer or non-portable electronic devices such as a desktop computer, game machine, TV and projector.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
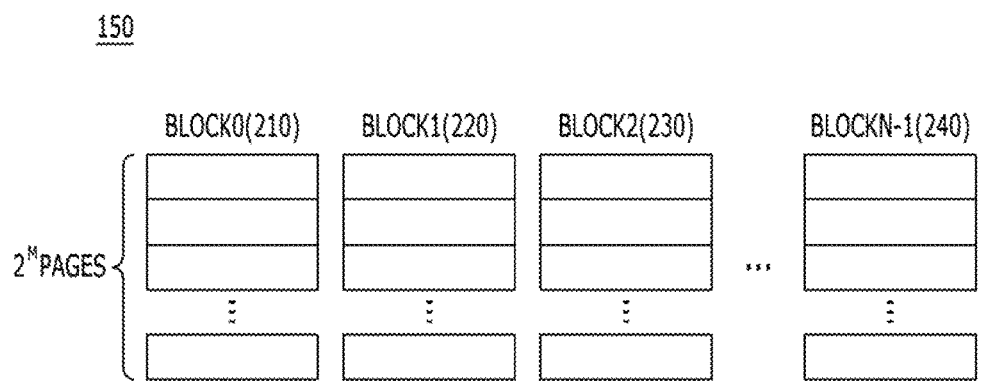
FIG. 2 is a schematic diagram illustrating an exemplary configuration of a memory device employed in the memory system of FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, a triple level cell (TLC) storing 3-bit data, a quadruple level cell (QLC) storing 4-bit level cell, a multiple level cell storing 5-or-more-bit data, and so forth.

Figure 3:
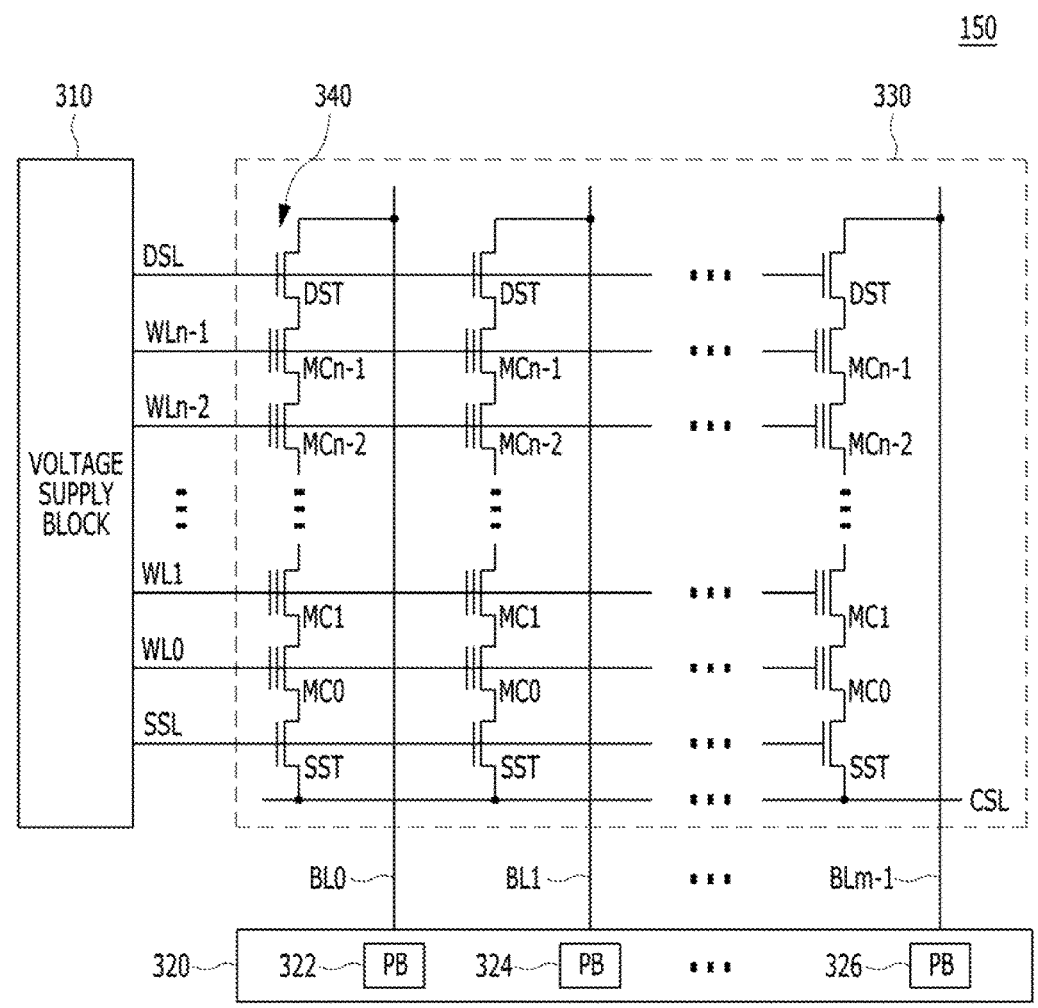
FIG. 3 is a circuit diagram illustrating an exemplary configuration of a memory cell array of a memory block in the memory device of FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
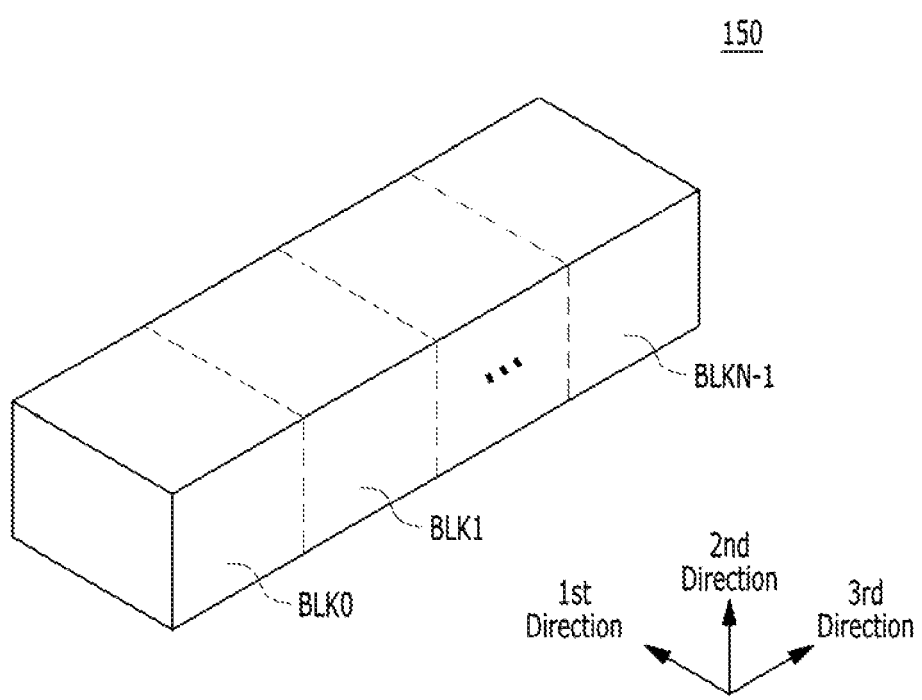
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each of the memory blocks having a 3D structure (or vertical structure).

Figure 5:
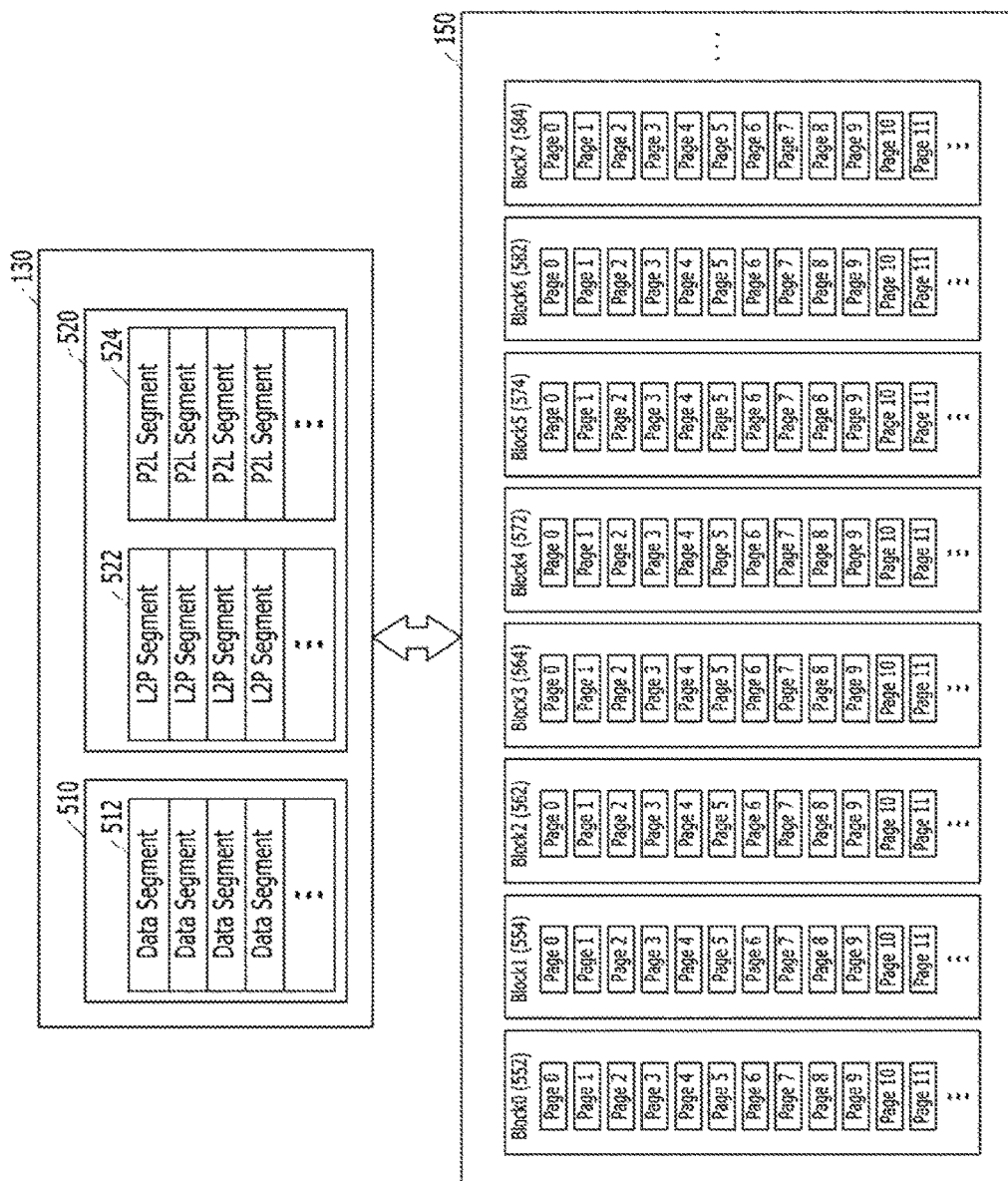
FIGS. 5 to 7 illustrate an operation of the memory system shown in FIG. 1.
Figure 6:
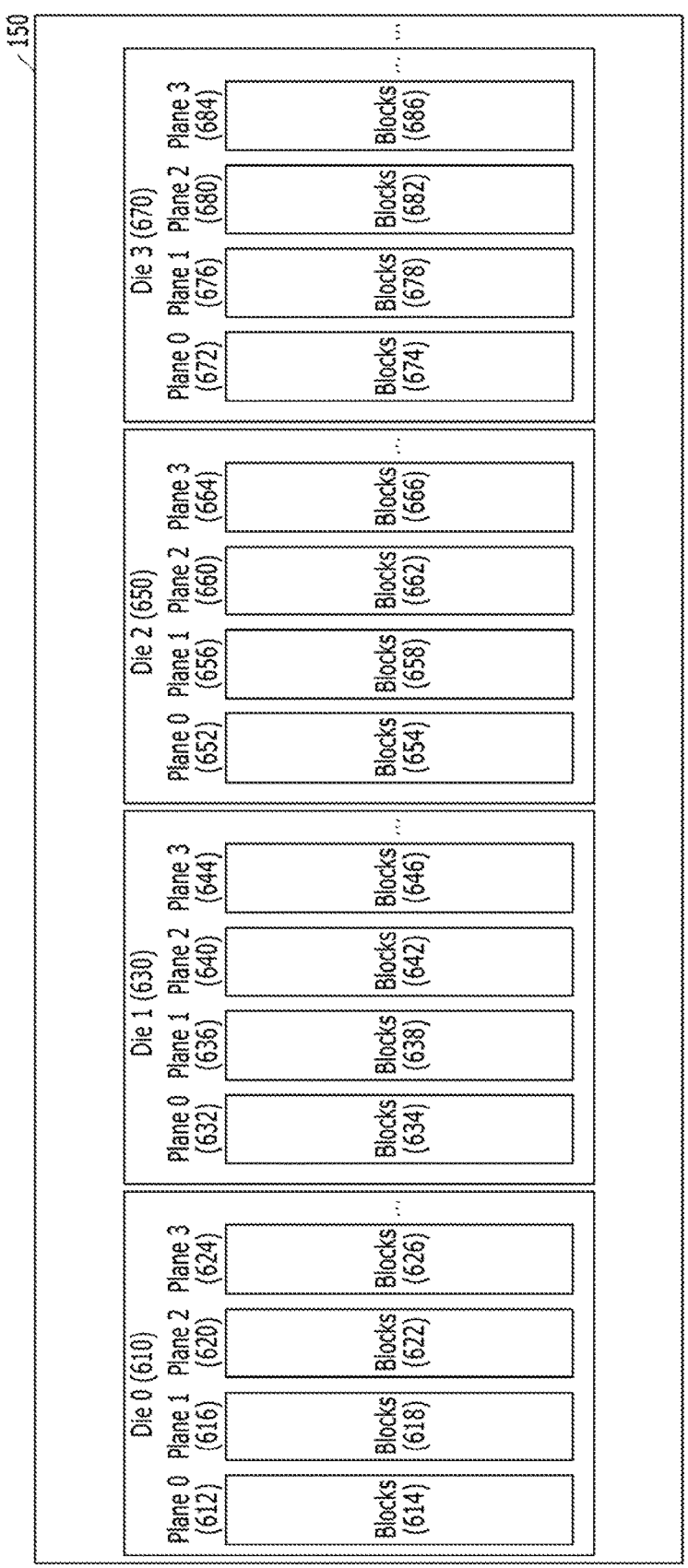
Figure 7:

FIGS. 5 to 7 illustrate an operation of the memory system 110.

When receiving a read command from the host 102, the controller 130 reads data from the memory device 150 in response to the read command and then provides the read data to the host 102. During the read operation, the controller 130 performs an error correction decoding operation when a read failure occurs. In particular, the controller 130 performs repeatedly an error correction decoding operation by a preset maximum count till a read success.

In the embodiment of the present disclosure, the controller 130 classifies the memory blocks by the characteristics of the memory blocks, which vary according to the error correction decoding operations to the memory blocks, and manages the memory blocks by the classification.

Furthermore, in the embodiment of the present disclosure, each of the plurality of memory blocks included in the memory device 150 may be divided into a plurality of sub memory blocks. The controller 130 checks failure information of the error correction decoding operation to the sub memory blocks when checking the characteristics of the memory blocks. After classifying the memory blocks by the characteristics thereof, the memory blocks are managed by the classification. When performing read operations in the memory blocks, the controller 130 updates a characteristic list for the memory blocks according to error correction decoding operations, and manages the memory blocks by checking the characteristics of the memory blocks through the characteristic list.

Referring to FIG. 5, during the read operation, the controller 130 loads the map segments of user data corresponding to the read command, for example, L2P segments 522 of first map data and P2L segments 524 of second map data, in the second buffer 520, and checks the L2P segments 522 and the P2L segments 524. After that, the controller 130 reads the user data stored in the pages included in corresponding memory blocks among the memory blocks 552, 554, 562, 564, 572, 574, 582 and 584 of the memory device 150, stores data segments 512 of the read user data in the first buffer 510, and provides the data segments 512 to the host 102.

Referring to FIGS. 6 and 7, in response to read commands the controller 130 performs read operations, to one or more among the plurality of memory blocks, for example, a memory block 10, a memory block 25, a memory block 35, a memory block 50, a memory block 70 and a memory block 80 (collectively referred to as "target memory blocks"). The controller 130 performs error correction decoding operations (e.g., one or more of the hard and soft decoding operations) to the respective target memory blocks when read failures occur in the respective target memory blocks during the read operations to the respective target memory blocks.

For example, the controller 130 repeatedly performs an error correction decoding operation to each of read-failed ones among the respective target memory blocks a predetermined number of times until the read operation is successful.

The controller 130 may perform the above-described error correction decoding operations the ECC unit 138 as described with reference to FIG. 1.

During read operations to the respective target memory blocks, the controller 130 updates a characteristic list 700 for the target memory blocks each time the controller 130 performs the error correction decoding operation to the respective target memory blocks.

Each time the controller 130 performs a single error correction decoding operation to the respective target memory blocks, the controller 130 updates error correction counts 704 of the respective target memory blocks, failure information 708, 710, 712, 714, 716 and 718 of the error correction decoding operation to the sub memory blocks included in the respective target memory blocks and distribution degrees 706 of the respective target memory blocks according to the failure information of the error correction decoding operation to the sub memory blocks.

In the error correction counts 704 of the characteristic list 700, numbers of operation times of the error correction decoding operations to the respective target memory blocks are recorded. For example, FIG. 7 exemplifies 13 operation times of the error correction decoding operations to the memory block 10 among the target memory blocks.

Also, assuming that the respective target memory blocks include six sub memory blocks, in the failure information 708, 710, 712, 714, 716 and 718 of the error correction decoding operation to the six sub memory blocks included in each of the target memory blocks in the characteristic list 700, numbers of operation times of the error correction decoding operations to the respective sub memory blocks, which are identified through the error correction decoding operations to the respective target memory blocks, are recorded. For example, FIG. 7 exemplifies 6 operation times of the error correction decoding operations to a sub memory block 1 (denoted with reference "708" in FIG. 7) of the memory block 10.

In addition, in the distribution degree 706 of the characteristic list 700, numbers of the sub memory blocks, to which the error correction decoding operations are performed in the respective target memory blocks, are recoded. For instance, FIG. 7 exemplifies 3 sub memory blocks (i.e., sub memory blocks 1, 4 and 6 as shown in FIG. 7) of the memory block 10.

As describe above, each time the controller 130 performs a single error correction decoding operation to the respective target memory blocks, the controller 130 updates the characteristic list 700 for the target memory blocks.

For instance, the controller 130 classifies the memory blocks into several characteristic memory block groups according to the error correction counts 704 of the memory blocks and threshold values. For example, one or more memory blocks having the error correction counts 704 smaller than a first count threshold value among the memory blocks may be classified into a first characteristic memory block group, one or more memory blocks having the error correction counts 704 between the first count threshold value and a second count threshold value among the memory blocks may be classified into a second characteristic memory block group, and one or more memory blocks having the error correction counts 704 greater than the second count threshold value among the memory blocks may be classified into a third characteristic memory block group. For example, the first to third characteristic memory block groups may represent memory block groups of good, bad and worse characteristics, respectively.

For instance of FIG. 7, assuming that the first count threshold value is 10 and the second count threshold value is 15, the controller 130 classifies the memory block 10, the memory block 25, the memory block 35 and the memory block 80 into the second characteristic memory block group, and classifies the memory block 50 and the memory block 70 into the third characteristic memory block group.

The controller 130 further classifies memory blocks of the second characteristic memory block group according to the distribution degree 706 of the memory blocks of the second characteristic memory block group. For example, among the memory blocks of the second characteristic memory block group, one or more memory blocks each having a part of sub memory blocks, to which the error correction decoding operations are performed, may be further classified into an upper second characteristic memory block group. For example, among the memory blocks of the second characteristic memory block group, one or more memory blocks each having all of sub memory blocks, to which the error correction decoding operations are performed, may be further classified into an lower second characteristic memory block group.

As exemplified in FIG. 7, the memory blocks 10, 25, 35 and 80 of the second characteristic memory block group have values of 3, 6, 2 and 6 of the distribution degree 706, respectively. Therefore, the controller 130 may further classify the memory blocks 10 and 35 each having a part of sub memory blocks (i.e., respectively 3 and 2 sub memory blocks), to which the error correction decoding operations are performed, into the upper second characteristic memory block group. Further, the controller 130 may further classify the memory blocks 25 and 80 each having all of sub memory blocks (i.e., 6 sub memory blocks), to which the error correction decoding operations are performed, into the lower second characteristic memory block group.

The controller 130 further classifies sub memory blocks of the upper second characteristic memory block group according to the failure information 708, 710, 712, 714, 716 and 718 of the error correction decoding operation to the sub memory blocks in the respective memory blocks of the upper second characteristic memory block group. For example, in the respective memory blocks of the upper second characteristic memory block group, one or more sub memory blocks each having a zero value of the failure information 708, 710, 712, 714, 716 and 718 may be further classified into a first characteristic sub memory block group. Also, in the respective memory blocks of the upper second characteristic memory block group, one or more sub memory blocks each having a non-zero value of the failure information 708, 710, 712, 714, 716 and 718 may be further classified into a second characteristic sub memory block group. As exemplified in FIG. 7, in the memory block 10 of the upper second characteristic memory block group, sub memory blocks 2, 3 and 5 respectively have a zero value of the failure information 710, 712 and 716. Therefore, the controller 130 may further classify the sub memory blocks 2, 3 and 5 of the memory block 10 into the first characteristic sub memory block group. Also, in the memory block of the upper second characteristic memory block group, sub memory blocks 1, 4 and 6 respectively have a non-zero value of the failure information 708, 714 and 718. Therefore, the controller 130 may further classify the sub memory blocks 1, 4 and 6 of the memory block 10 into the second characteristic sub memory block group. Also, in the memory block 35 of the upper second characteristic memory block group, sub memory blocks 1, 2, 4 and 6 respectively have a zero value of the failure information 708, 710, 714 and 718. Therefore, the controller 130 may further classify the sub memory blocks 1, 2, 4 and 6 of the memory block 35 into the first characteristic sub memory block group. Also, in the memory block 35 of the upper second characteristic memory block group, sub memory blocks 3 and 5 respectively have a non-zero value of the failure information 712 and 716. Therefore, the controller 130 may further classify the sub memory blocks 3 and 5 of the memory block 35 into the second characteristic sub memory block group.

The controller 130 further classifies sub memory blocks of the lower second characteristic memory block group according to the failure information 708, 710, 712, 714, 716 and 718 of the error correction decoding operation to the sub memory blocks in the respective memory blocks of the lower second characteristic memory block group. For example, in the respective memory blocks of the lower second characteristic memory block group, one or more sub memory blocks each having a value of the failure information 708, 710, 712, 714, 716 and 718, which is equal to or smaller than an error threshold value, may be further classified into a second characteristic sub memory block group.

Assuming that the error threshold value is 2, referring to the example of FIG. 7, in the memory block 25 of the lower second characteristic memory block group, sub memory blocks 1, 2, 4 and 5 respectively have values of the failure information 708, 710, 714 and 716, each of which is equal to or smaller than the error threshold value. Therefore, the controller 130 may further classify the sub memory blocks 1, 2, 4 and 5 of the memory block 25 into the second characteristic sub memory block group. Also, in the memory block 80 of the lower second characteristic memory block group, sub memory blocks 1, 3 and 6 respectively have values of the failure information 708, 712 and 718, each of which is equal to or smaller than the error threshold value. Therefore, the controller 130 may further classify the sub memory blocks 1, 3 and 6 of the memory block 80 into the second characteristic sub memory block group.

The controller 130 manages memory blocks of the same characteristic memory block group in the same manner, and so does the sub memory blocks of the same characteristic sub memory block group.

For example, the controller 130 uses the sub memory blocks 2, 3 and 5 of the first characteristic sub memory block group in the memory block 10 of the upper second characteristic memory block group, and the sub memory blocks 1, 2, 4 and 6 of the first characteristic sub memory block group in the memory block 35 of the upper second characteristic memory block group in a normal mode. For example, the controller 130 may control the memory device 150 to perform normal program operations to the sub memory blocks of the first characteristic sub memory block group in the upper second characteristic memory block group. In this regard, the controller 130 may collect those sub memory blocks of the first characteristic sub memory block group in the memory blocks of the upper second characteristic memory block group (e.g., the sub memory blocks 2, 3 and 5 of the memory block 10 and the sub memory blocks 1, 2, 4 and 6 of the memory block 35) as a new memory block through the interleaving scheme during the normal program operation.

In addition, the controller 130 uses the sub memory blocks 1, 2, 4 and 5 of the second characteristic sub memory block group in the memory block 25 of the lower second characteristic memory block group, and the sub memory blocks 1, 3 and 6 of the second characteristic sub memory block group in the memory block 80 of the lower second characteristic memory block group in an urgent mode. For example, the controller 130 may control the memory device 150 to perform urgent program operations to the sub memory blocks of the second characteristic sub memory block group in the lower second characteristic memory block group. The urgent program operation may be the one to be performed when the memory device 150 runs out of the storage capacity or when the host 102 requests a program operation with data requiring a great amount of storage capacity. In this regard, the controller 130 may collect those sub memory blocks of the second characteristic sub memory block group in the memory blocks of the lower second characteristic memory block group (e.g., the sub memory blocks 1, 2, 4 and 5 of the memory block 25 and the sub memory blocks 1, 3 and 6 of the memory block 80) as a new memory block through the interleaving scheme during the urgent program operation.

The controller 130 may use, in a specified mode, sub memory blocks of the second characteristic in the memory blocks of the upper second characteristic. The controller 130 may perform bad block management operations for the memory block 50 and the memory block 70 levelized and classified into memory blocks of the third characteristic, and may perform bad block management operations for the sub memory blocks of the third characteristic in the memory blocks of the second characteristic.

The controller 130 may classify data provided with commands from the host 102, by types, and store the classified data in the memory blocks and the sub memory blocks classified by characteristics as described above.

Figure 8:
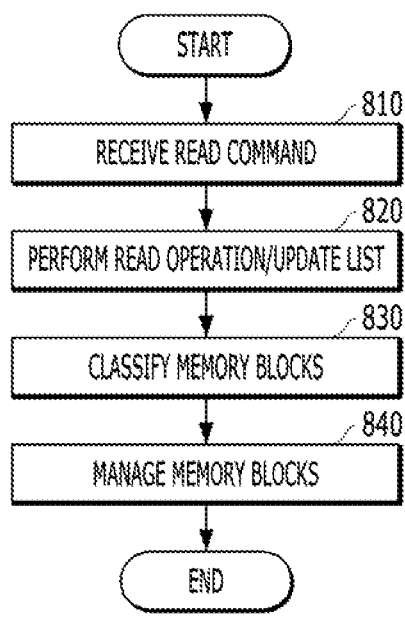
FIGS. 8 and 9 are flow charts illustrating an operation of the memory system shown in FIG. 1.
Figure 9:
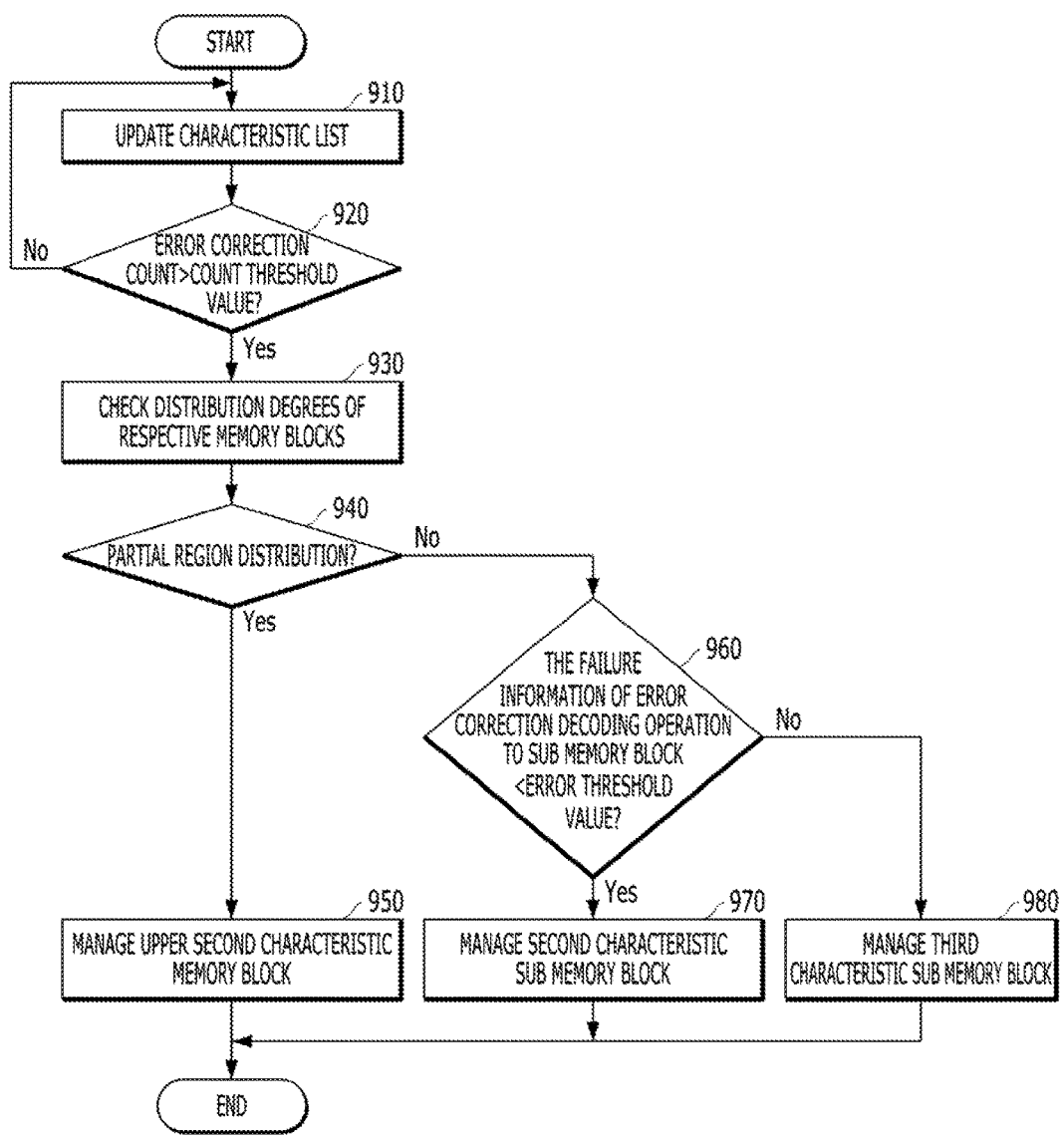

FIGS. 8 and 9 are representations of examples of schematic flow charts to assist in the explanation of operation processes for processing data in a memory system in accordance with an embodiment.

Referring to FIG. 8, at step 810, the memory system 110 receives read commands from the host 102, for the plurality of memory blocks.

At step 820, read operations corresponding to the read commands are performed for the plurality of memory blocks, and, when performing the read operations in the memory blocks, error correction decoding operations are performed for memory blocks where read failures occurred and a characteristic list for the memory blocks is updated in correspondence to the performing of the error correction decoding operations. The error correction decoding operations for the memory blocks where read failures occurred are performed repeatedly by a maximum count till read successes, and the characteristic list for the memory blocks is updated in correspondence to the performing of such repetitive error correction decoding operations.

Then, at step 830, through the characteristic list for the memory blocks, the characteristics of the memory blocks are checked, and the memory blocks are levelized and classified by the characteristics of the memory blocks. In this regard, through the characteristic list, the characteristics of the plurality of sub memory blocks included in the memory blocks are checked, and the sub memory blocks are levelized and classified by the characteristics of the sub memory blocks.

At step 840, the memory blocks and the sub memory blocks included in the memory blocks, which are levelized and classified, are managed. The memory blocks of the same characteristic or the sub memory blocks of the same characteristic are managed in the same manner. Hereinbelow, an operation process for classifying and managing the memory blocks in a memory system in accordance with an embodiment will be described below in detail with reference to FIG. 9.

Referring to FIG. 9, at step 910, the memory system 110 updates the characteristic list for the plurality of memory blocks, when the error correction decoding operations are performed for the memory blocks where read failures occurred, among the memory blocks, that is, when the error correction decoding operations are performed for the plurality of memory blocks, as described above. In this regard, in the case of performing hard decoding (or hard decision decoding) operations through scan read operations or performing soft decoding (or soft decision decoding) operations for the memory blocks where read failures occurred, among the plurality of memory blocks, the update of the characteristic list for the plurality of memory blocks may be performed. As described above, in the embodiment of the present disclosure, for the sake of convenience in explanation, detailed descriptions will be made by taking an example that the characteristic list for the memory blocks is updated at each time of performing an error correction decoding operation for the plurality of memory blocks. In the update of the characteristic list for the memory blocks, in correspondence to the performing of the error correction decoding operations for the respective target memory blocks, error correction counts of the respective target memory blocks, the failure information of the error correction decoding operation to the sub memory blocks included in the respective target memory blocks and distribution degrees of the respective target memory blocks according to the failure information of the error correction decoding operation to the sub memory blocks are updated by indexes indicating the memory blocks of the memory device 150.

At step 920, by checking the error correction counts of the respective target memory blocks through the characteristic list for the memory blocks, the characteristics of the respective target memory blocks are checked. In this connection, when the error correction counts of memory blocks are equal to or smaller than a count threshold value, the memory blocks are managed as memory blocks of a first characteristic, and error correction decoding operations are performed for the memory blocks of the first characteristic.

When the error correction counts of memory blocks are larger than the count threshold value, at step 930, the distribution degrees of the respective target memory blocks are checked. When the error correction counts of respective target memory blocks are larger than the count threshold value, the memory blocks are managed as memory blocks of a second characteristic or memory blocks of a third characteristic. At the step 930, the distribution degrees of the memory blocks of the second characteristic or the memory blocks of the third characteristic are checked. In other words, the failure information of the error correction decoding operation to the sub memory blocks included in the memory blocks of the second characteristic or the memory blocks of the third characteristic are checked. Namely, by checking the distribution degrees of the respective target memory blocks through the characteristic list, the distribution degree of numbers of operation times of the error correction decoding operations to the sub memory blocks included in the respective target memory blocks are checked.

At step 940, by checking the distribution degree of numbers of operation times of the error correction decoding operations to the sub memory blocks included in the respective target memory blocks, whether numbers of operation times of the error correction decoding operations are distributed over partial regions or entire regions in the respective target memory blocks is checked.

Then, at step 950, memory blocks in which numbers of operation times of the error correction decoding operations are distributed over partial regions in the respective target memory blocks are managed as memory blocks of an upper second characteristic.

At step 960, after checking memory blocks in which numbers of operation times of the error correction decoding operations are distributed over entire regions in the respective target memory blocks, the failure information of error correction decoding operation to the sub memory blocks in the memory blocks in which numbers of operation times of the error correction decoding operations are distributed over entire regions and an error threshold value are checked.

Then, at step 970, in the memory blocks in which numbers of operation times of the error correction decoding operations are distributed over entire regions, when the failure information of error correction decoding operation to sub memory blocks are equal to or smaller than the error threshold value, the sub memory blocks are managed as sub memory blocks of the second characteristic.

At step 980, in the memory blocks in which numbers of operation times of the error correction decoding operations are distributed over entire regions, when the failure information of error correction decoding operation to sub memory blocks are larger than the error threshold value, the sub memory blocks are managed as sub memory blocks of the third characteristic.

Since detailed descriptions were made above with reference to FIGS. 5 to 7, for the operations of performing the error correction decoding operations in the case of performing read operations corresponding to read commands, in the plurality of memory blocks, and updating the characteristic list in correspondence to the performing of the error correction decoding operations, and operations of checking the characteristics of the memory blocks by using the characteristic list, classifying the memory blocks by levelizing them by the characteristics thereof and then characterizing and managing the memory blocks, further descriptions thereof will be omitted herein.

FIGS. 10 to 18 are diagrams schematically illustrating application examples of the data processing system of FIG. 1.

Figure 10:
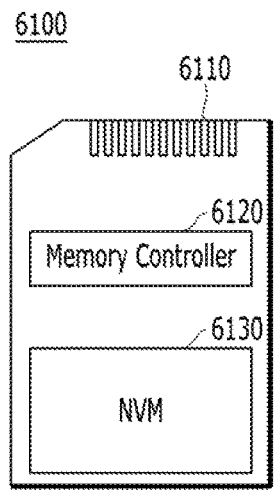
FIGS. 10 to 18 are diagrams schematically illustrating application examples of the data processing system shown in FIG. 1.

FIG. 10 is a diagram schematically illustrating another example of the data processing system 100. FIG. 10 schematically illustrates a memory card system to which the memory system in accordance with the present embodiment is applied.

Referring to FIG. 10, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 11:
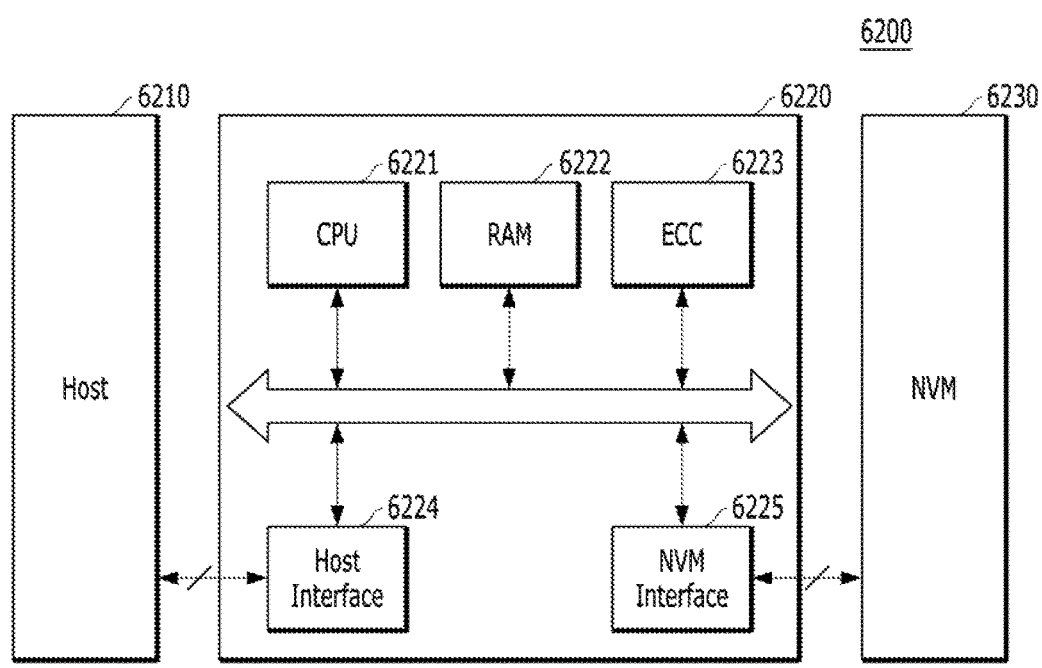

FIG. 11 is a diagram schematically illustrating another example of the data processing system including the memory system in accordance with the present embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 12:
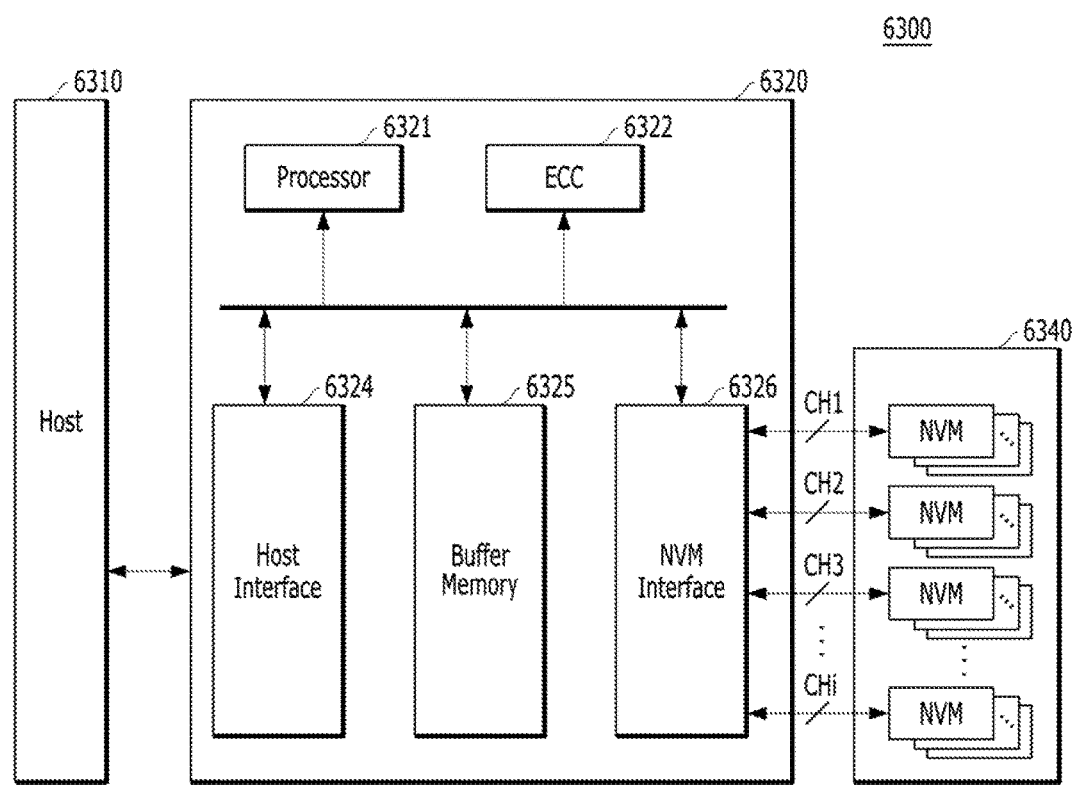

FIG. 12 is a diagram schematically illustrating another example of the data processing system including the memory system in accordance with an embodiment. FIG. 12 schematically illustrates an SSD including the memory system 110.

Referring to FIG. 12, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 11 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
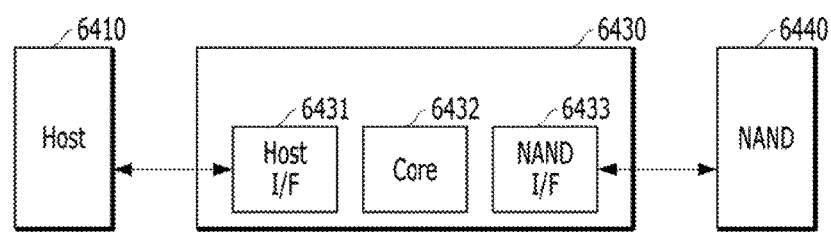

FIG. 13 is a diagram schematically illustrating another example of the data processing system including the memory system in accordance with an embodiment. FIG. 13 schematically illustrates an embedded Multi-Media Card (eMMC) including the memory system 110.

Referring to FIG. 13, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with an embodiment. Specifically, FIGS. 14 to 17 schematically illustrate Universal Flash Storage (UFS) systems including the memory system 110.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI Unified Protocol (UniPro) in Mobile Industry Processor Interface (MIPI). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 14:
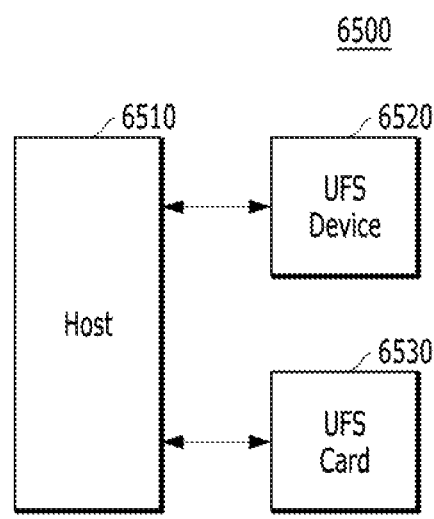

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 15:
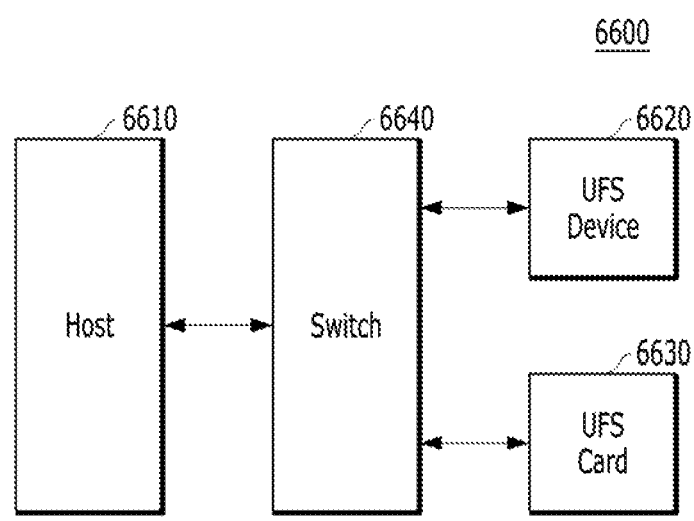

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 16:
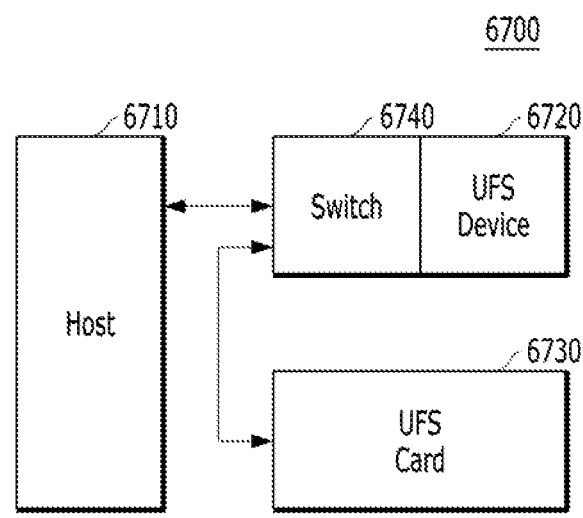

In the UFS system 6700 illustrated in FIG. 16, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 17:
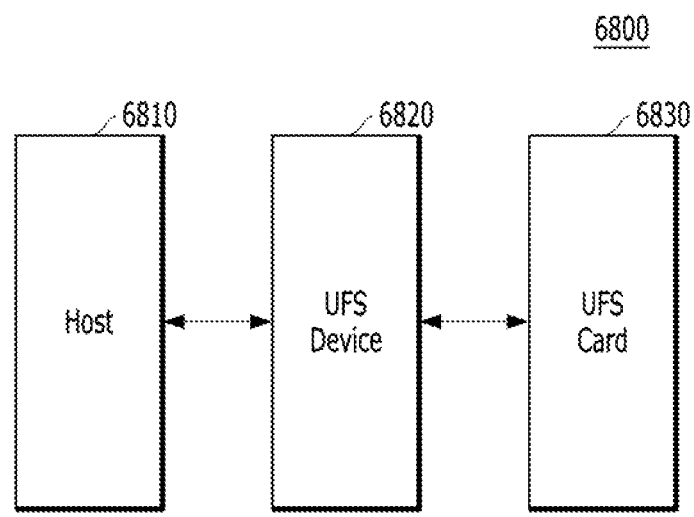

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
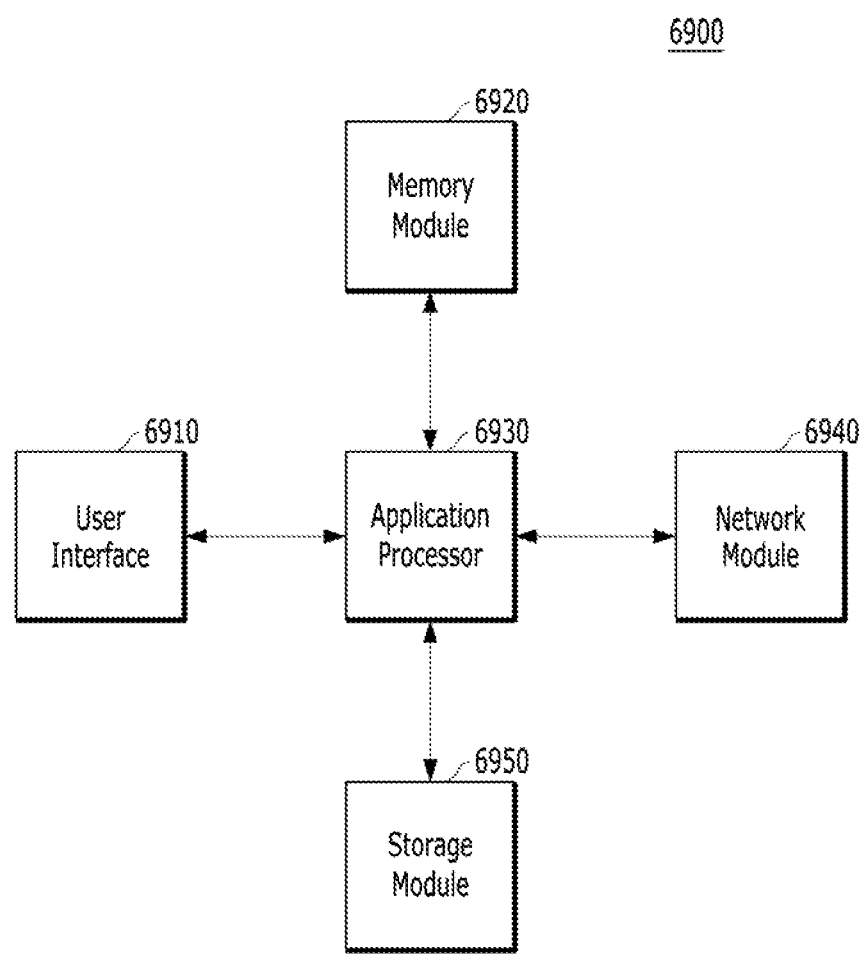

FIG. 18 is a diagram schematically illustrating another example of the data processing system including a memory system in accordance with an embodiment. FIG. 18 is a diagram schematically illustrating a user system including the memory system 110.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, eMMC and UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In the memory system and the operating method thereof in accordance with embodiments, it is possible to minimize complexity and performance deterioration of the memory system, maximize the use efficiency of a memory device, and quickly and stably process data to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
 a memory device including a plurality of memory blocks each having a plurality of sub memory blocks; and
 a controller suitable for performing an error correction decoding operation to at least one sub memory block of the memory blocks during a read operation, updating a characteristic list for each memory block based on a total number of plural counts, each indicating how many error correction decoding operation are performed to each sub memory block of each memory block, classifying the memory blocks according to the updated values in the characteristic list, and performing a program operation to the memory blocks according to the classification.

2. The memory system according to claim 1, wherein the characteristic list contains error correction counts for each sub memory block and wherein the controller updates the error correction counts in the characteristic list by counting the error correction decoding operations which are performed to the respective sub memory blocks of each memory block during the read operation.

3. The memory system according to claim 2,
 wherein the respective memory blocks include a plurality of sub memory blocks, and
 wherein the sub memory blocks are configured as a plurality of word lines included in the memory blocks are grouped or a plurality of pages included in the memory blocks are grouped.

4. The memory system according to claim 2, wherein the controller updates the characteristic list further by counting, as distribution degrees for each of the memory blocks, a number of sub memory blocks, to which the error correction decoding operation is performed in a corresponding memory block during the read operation, into the characteristic list.

5. The memory system according to claim 4, wherein the controller determines characteristics by the memory blocks and characteristics by the sub memory blocks of the memory blocks, through the error correction counts and the distribution degrees.

6. The memory system according to claim 5, wherein the controller levelizes and classifies the memory blocks and the sub memory blocks according to the characteristics by the memory blocks and the characteristics by the sub memory blocks.

7. The memory system according to claim 6, wherein the controller classifies and manages memory blocks of the same characteristic and sub memory blocks of the same characteristic, in the same manner.

8. The memory system according to claim 7,
 wherein the controller performs command operations corresponding to commands received from the host, in a general mode, for memory blocks and sub memory blocks of an upper characteristic, and
 wherein the controller performs command operations corresponding to commands received from the host, in a specified mode, for memory blocks and sub memory blocks of a lower characteristic.

9. The memory system according to claim 7, wherein the controller performs command operations corresponding to commands received from the host, by the memory blocks, through interleaving the sub memory blocks of the same characteristic.

10. A method for operating a memory system including a plurality of memory blocks each having a plurality of sub memory blocks, the method comprising:
 performing an error correction decoding operation to at least one sub memory block of the memory blocks during a read operation;
 updating a characteristic list for each memory block based on a total number of plural counts, each indicating how many error correction decoding operation are performed to each sub memory block of each memory block;
 classifying the memory blocks according to the values updated in the characteristic list; and
 performing a program operation to the memory blocks according to the classification.

11. The method according to claim 10, wherein the characteristic list contains error correction counts for each sub memory block and wherein the updating comprises updating the error correction counts in the characteristic list by counting the error correction decoding operations which are performed to the respective sub memory blocks of each memory block during the read operation.

12. The method according to claim 11,
 wherein the respective memory blocks include a plurality of sub memory blocks, and
 wherein the sub memory blocks are configured as a plurality of word lines included in the memory blocks are grouped or a plurality of pages included in the memory blocks are grouped.

13. The method according to claim 11, wherein the updating comprises counting, as distribution degrees for each of the memory blocks, a number of sub memory blocks, to which the error correction decoding operation is performed in a corresponding memory block during the read operation, into the characteristic list.

14. The method according to claim 13, wherein the classifying comprises:
 determining characteristics by the memory blocks and characteristics by the sub memory blocks of the memory blocks, through the error correction counts and the distribution degrees.

15. The method according to claim 14, wherein the classifying further comprises:

levelizing and classifying the memory blocks and the sub memory blocks according to the characteristics by the memory blocks and the characteristics by the sub memory blocks.

16. The method according to claim 15, wherein the classifying classifies and manages memory blocks of the same characteristic and sub memory blocks of the same characteristic, in the same manner.

17. The method according to claim 16, further comprising:
performing command operations corresponding to commands received from the host, in a general mode, for memory blocks and sub memory blocks of an upper characteristic; and
performing command operations corresponding to commands received from the host, in a specified mode, for memory blocks and sub memory blocks of a lower characteristic.

18. The method according to claim 16, further comprising:
performing command operations corresponding to commands received from the host, by the memory blocks, through interleaving the sub memory blocks of the same characteristic.

* * * * *